(12) United States Patent
Seetharaman et al.

(10) Patent No.: US 11,361,644 B2
(45) Date of Patent: Jun. 14, 2022

(54) DUTY CYCLE TUNING IN SELF-RESONANT PIEZO BUZZER

(71) Applicant: Texas Instruments Incorporated, Dallas, TX (US)

(72) Inventors: Narayanan Seetharaman, Unterschleissheim (DE); Grant Evan Falkenburg, Dallas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/719,147

(22) Filed: Dec. 18, 2019

(65) Prior Publication Data
US 2021/0192912 A1    Jun. 24, 2021

(51) Int. Cl.
| | |
|---|---|
| G08B 17/117 | (2006.01) |
| H03K 5/156 | (2006.01) |
| H04L 41/04 | (2022.01) |
| G08B 3/10 | (2006.01) |
| G08B 17/11 | (2006.01) |
| G08B 17/103 | (2006.01) |
| H04L 12/40 | (2006.01) |
| H01L 41/047 | (2006.01) |
| H01L 41/04 | (2006.01) |
| H01L 41/113 | (2006.01) |

(52) U.S. Cl.
CPC ............ *G08B 17/117* (2013.01); *G08B 3/10* (2013.01); *G08B 17/103* (2013.01); *G08B 17/11* (2013.01); *H01L 41/042* (2013.01); *H01L 41/113* (2013.01); *H03K 5/1565* (2013.01); *H04L 12/40* (2013.01); *H01L 41/047* (2013.01); *H04L 2012/40208* (2013.01)

(58) Field of Classification Search
CPC .................................................... G08B 17/117
See application file for complete search history.

(56) References Cited

U.S. PATENT DOCUMENTS

| 4,445,031 A | 4/1984 | Kamoshida |
|---|---|---|
| 5,912,626 A | 6/1999 | Soderland |
| 5,982,158 A | 11/1999 | Schnars |
| | (Continued) | |

FOREIGN PATENT DOCUMENTS

| CN | 105045185 A | 11/2015 |
|---|---|---|
| CN | 204991123 U | 1/2016 |
| | (Continued) | |

OTHER PUBLICATIONS

RU113392U1 Machine Translation (Russian publication 2012. Translation 2022).*
PCT Search Report dated Apr. 9, 2021.

*Primary Examiner* — Nabil H Syed
*Assistant Examiner* — Cal J Eustaquio
(74) *Attorney, Agent, or Firm* — Ray A. King; Charles A. Brill; Frank D. Cimino

(57) ABSTRACT

An electronic device includes a driver circuit embodied on an IC chip. The driver circuit includes a threshold voltage selection circuit that is coupled to receive a horn comparator threshold setting and to use the horn comparator threshold setting to provide a horn comparator threshold voltage. The driver circuit also includes a comparator that has a non-inverting input coupled to a first pin and an inverting input coupled to receive the horn comparator threshold voltage.

37 Claims, 8 Drawing Sheets

(56) References Cited

U.S. PATENT DOCUMENTS

| | | |
|---|---|---|
| 8,362,842 B1 | 1/2013 | Xu |
| 8,510,068 B2 | 8/2013 | Kawashima |
| 9,148,094 B1 | 9/2015 | Swoboda |
| 9,438,353 B2 | 9/2016 | Yun et al. |
| 9,710,001 B2 | 7/2017 | Smith et al. |
| 9,946,279 B1 | 4/2018 | Dinnh |
| 9,958,885 B2 | 5/2018 | Smith et al. |
| 2005/0276080 A1* | 12/2005 | Okada .................... G02B 7/102 363/41 |
| 2006/0184847 A1 | 8/2006 | Song |
| 2008/0007344 A1 | 1/2008 | Natzke |
| 2011/0031419 A1 | 2/2011 | Fukui |
| 2011/0283141 A1 | 11/2011 | Lee |
| 2012/0161733 A1 | 6/2012 | Hua |
| 2013/0076324 A1 | 3/2013 | Fujii |
| 2014/0327630 A1 | 11/2014 | Burr et al. |
| 2016/0232781 A1 | 8/2016 | Sangha |
| 2016/0299518 A1 | 10/2016 | Iwata |
| 2017/0287309 A1 | 10/2017 | Gerbus |
| 2017/0351285 A1 | 12/2017 | Iwata |
| 2021/0312780 A1 | 10/2021 | Morita |
| 2021/0327239 A1 | 10/2021 | Falkenburg |

FOREIGN PATENT DOCUMENTS

| | | |
|---|---|---|
| CN | 205787995 U | 12/2016 |
| EP | 3812201 A1 | 4/2021 |
| GB | 2558877 A | 7/2018 |
| JP | 01248197 A | 10/1989 |
| JP | 03100814 A | 4/1991 |
| JP | 2010160750 | 7/2010 |
| RU | 537 | 6/1995 |
| RU | 54450 U1 | 1/2006 |
| RU | 113392 | 10/2012 |
| RU | 2611021 C2 | 12/2016 |
| RU | 2638824 | 11/2017 |
| WO | 2013045446 | 4/2013 |
| WO | WO2018222905 A1 | 12/2018 |
| WO | 2019051815 A1 | 3/2019 |

* cited by examiner

DUTY CYCLE TUNING IN SELF-RESONANT PIEZO BUZZER

CROSS-REFERENCE TO RELATED APPLICATIONS

This patent application is related to: U.S. application Ser. No. 16/674,758, filed Nov. 5, 2019, now pending; U.S. application Ser No. 16/674,577, filed Nov. 5, 2019, now U.S. Pat. No. 10,942,536, issued Mar. 9, 2021; U.S. application Ser. No. 16/850,237, filed Apr. 16, 2020, now pending; and U.S. application Ser. No. 16/838,995, filed Apr. 2, 2020, now pending.

BACKGROUND

The behavior of piezoelectric materials in a piezo buzzer varies from part to part and is further influenced by mechanical stresses from surrounding elements. Each piezo buzzer thus has a unique resonant frequency. In order to achieve maximum loudness, the piezo buzzers can be used in self-resonant mode, where a feedback terminal provides positive feedback to create a sustained oscillation at the piezo buzzer's own resonant frequency.

The loudness of a piezo buzzer, also referred to herein as a horn, depends on three major parameters: (1) frequency, (2) amplitude and (3) duty cycle of the clock signal applied across its plates. The maximum achievable loudness from any buzzer is at the buzzer's resonant frequency, the maximum possible differential amplitude and fifty percent (50%) duty cycle. The oscillation amplitude is almost always set to a maximum possible voltage that the circuit can generate. Prior art driving circuits for a self-resonant piezo buzzer optimize only the frequency and amplitude.

SUMMARY

Disclosed embodiments provide an electronic device that includes an integrated circuit (IC) chip having a driver circuit for a piezo buzzer. The driver circuit uses a comparator, which has a horn comparator threshold voltage that is programmable, to convert the feedback voltage from an analog signal to a digital signal. Adjusting the horn comparator threshold voltage changes the duty cycle of the driving signals sent to the piezo buzzer. A number of horn comparator threshold settings, e.g., four, are provided. The piezo buzzer can be tested using two or more of the horn comparator threshold settings and a horn comparator threshold setting that provides a duty cycle that best approaches fifty percent can be selected. The ability to vary the duty cycle can be utilized to adjust for differences in piezo buzzers and in the fabrication of the driver circuit, which can affect the common mode and amplitude of the horn feedback signal. Accordingly, the loudness of the piezo buzzer can be further enhanced.

In one aspect, an embodiment of an electronic device is disclosed. The electronic device includes a threshold voltage selection circuit coupled to receive a horn comparator threshold setting and to use the horn comparator threshold setting to provide a horn comparator threshold voltage; and a comparator having a non-inverting input coupled to a first pin and an inverting input coupled to receive the horn comparator threshold voltage.

In another aspect, an embodiment of a method of operating a piezo buzzer is disclosed. The method includes coupling a driver circuit for the piezo buzzer between a microcontroller and the piezo buzzer; providing a first horn comparator threshold setting of a plurality of horn comparator threshold settings to the driver circuit and determining a first duty cycle of the piezo buzzer using the first horn comparator threshold setting; providing a second horn comparator threshold setting of the plurality of horn comparator threshold settings to the driver circuit and determining a second duty cycle of the piezo buzzer using the second horn comparator threshold setting; and selecting a horn comparator threshold setting of the plurality of horn comparator threshold settings that provides a respective duty cycle that is closest to fifty percent.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

A piezoelectric diaphragm or piezoelectric buzzer, also referred to herein simply as a piezo buzzer or horn, can be either externally driven or self-driven. An externally driven piezo buzzer contains two electrodes, while a self-driven piezo buzzer has an additional feedback electrode that is used to drive the piezo buzzer to a resonant frequency.

Figure 5:
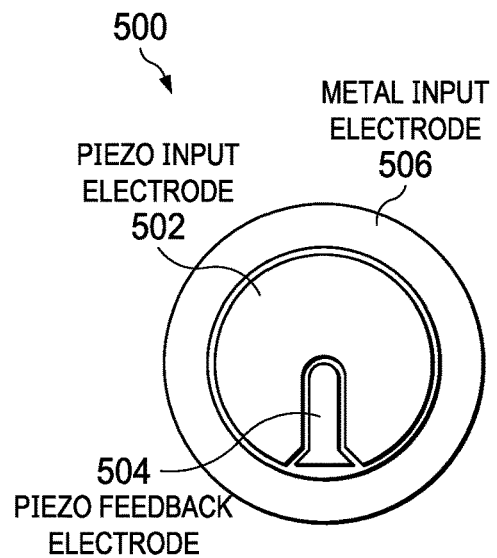
FIG. 5 depicts a piezoelectric buzzer that can be used with the disclosed driver circuit according to an embodiment of the disclosure.

FIG. 5 depicts a piezo buzzer 500 for use in a self-driving circuit. Piezo buzzer 500 includes a piezo input electrode 502, a piezo feedback electrode 504 and a metal input electrode 506. Piezo input electrode 502 and piezo feedback electrode 504 are each made of a piezoelectric ceramic material, are electrically isolated from each other, and are mounted to one side of metal input electrode 506 with an adhesive (not specifically shown). Piezoelectric materials exhibit specific phenomenon known as the piezoelectric effect and the reverse piezoelectric effect. Exposure to mechanical strain will cause the material to develop an electric field, and exposure to an electric field will cause the material to deform due to the mechanical strain.

Figure 6A:
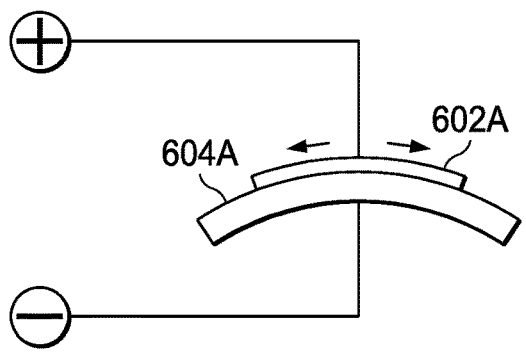
FIGS. 6A-6C depict the working principle of a piezo buzzer.
Figure 6B:
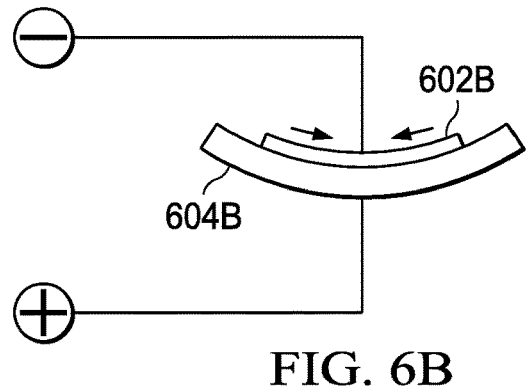
Figure 6C:
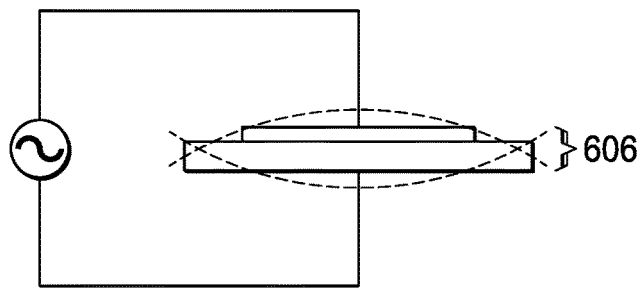

FIGS. 6A-6C depict the working principle of a piezo buzzer. In FIG. 6A, the piezo element 602A receives a positive voltage and metal plate 604A receives a negative voltage, causing piezo element 602A to expand and bending metal plate 604A away from piezo element 602A. In FIG. 6B, the piezo element 602B receives a negative voltage and metal plate 604B receives a positive voltage, causing piezo element 602B to contract and thus bending metal plate 604B towards piezo element 602B. FIG. 6C depicts an alternating current being applied to piezoelectric buzzer 606, causing vibrations in piezoelectric buzzer 606 to generate sound waves.

While magnetic buzzers can also be fabricated, piezo buzzers have lower current consumption while maintaining a higher sound pressure level. These attributes make them desirable in devices that rely on battery power but need high sound pressure levels, e.g., smoke alarms. Piezo buzzers generally have a wide operating voltage, e.g., between about 3 V and about 250 V, and a low current consumption, e.g., less than 30 mA in sound indication applications.

Figure 7A:
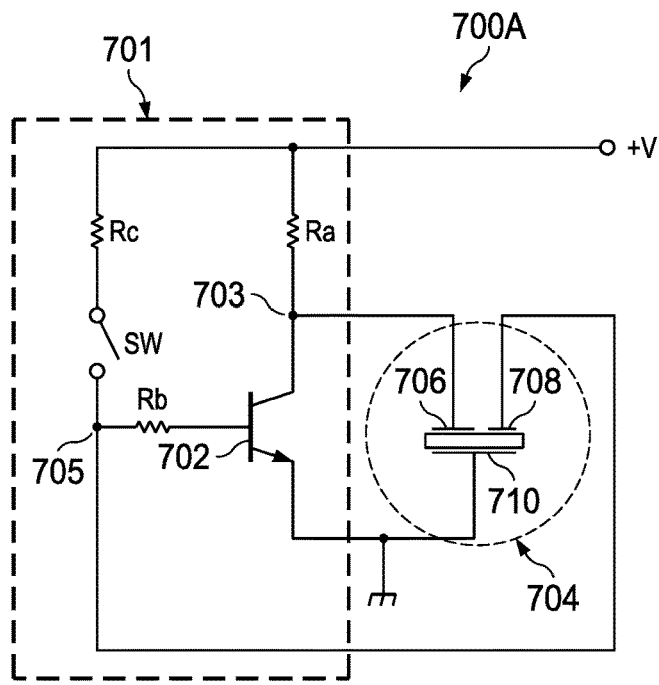
FIG. 7A depicts an analog circuit for a self-drive piezoelectric buzzer.

FIG. 7A depicts an electronic device 700A containing an analog self-drive circuit 701 for a piezoelectric buzzer 704. Analog self-drive circuit 701 includes a bipolar junction transistor (BJT) 702 that is coupled between an upper supply voltage and a lower supply voltage, which may be a ground node. The collector of BJT 702 is coupled to the upper supply voltage through resistor Ra and the emitter is coupled to the lower supply voltage. The piezo input electrode 706 of piezoelectric buzzer 704 is coupled to a node 703 between resistor Ra and the collector of BJT 702 while the metal input electrode 710 is coupled to the lower supply voltage. The piezo feedback electrode 708 is coupled to the gate of BJT 702 through resistor Rb. Additionally, a node 705 between the piezo feedback electrode 708 and resistor Rb is coupled to the upper supply voltage through resistor Rc, with a switch SW between node 705 and resistor Rc allowing BJT 702 to be turned off.

Figure 7B:
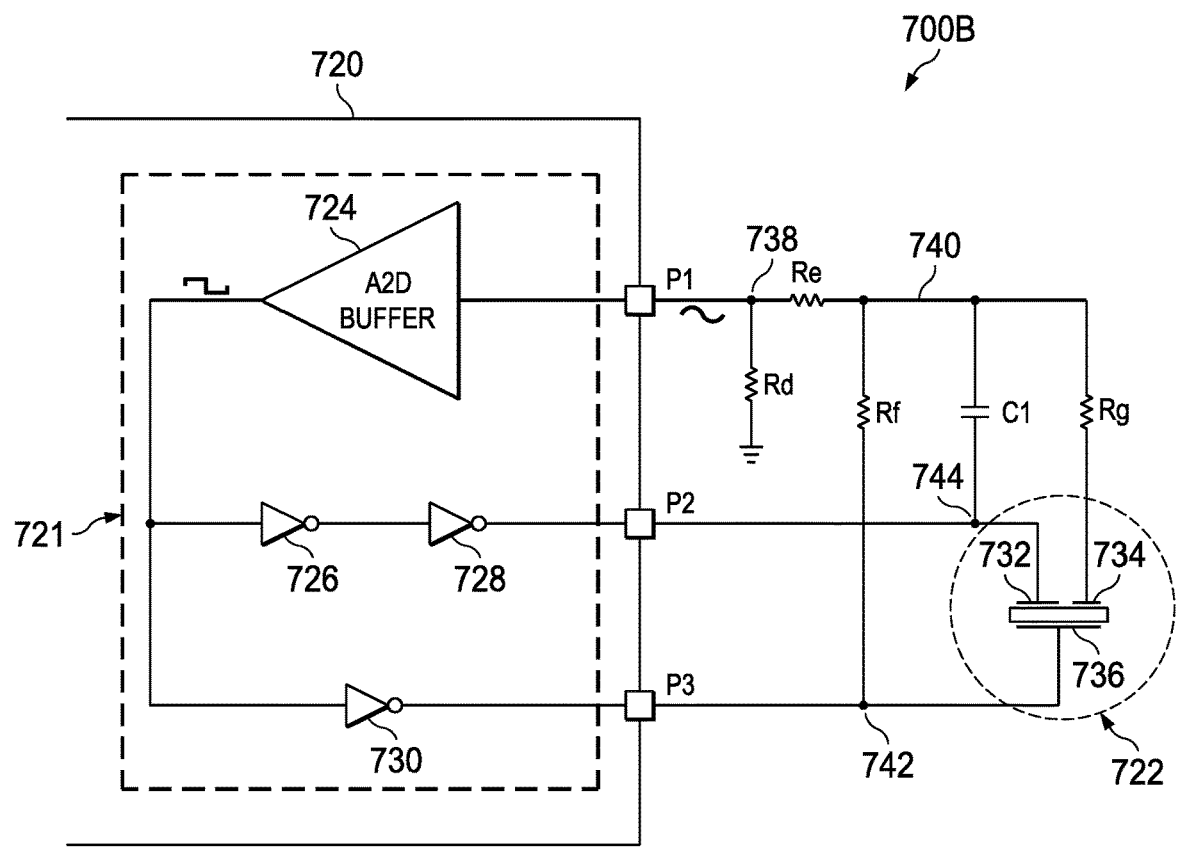
FIG. 7B depicts a digital circuit for a self-drive piezoelectric buzzer according to the prior art.

FIG. 7B depicts an electronic device 700B in which a driver circuit 721 on IC chip 720 is used to drive piezo buzzer 722. In driver circuit 721, an analog-to-digital (A2D) buffer 724 has an input coupled to a first pin P1 and an output coupled to an input of both inverter 726 and inverter 730. Inverter 726 has an output coupled to an input of inverter 728 and inverter 728 has an output coupled to a second pin P2. Inverter 730 has an output coupled to third pin P3.

Piezo buzzer 722 has a first input electrode 732, which is the piezo input electrode, a feedback electrode 734, which is also piezoelectric, and a second input electrode 736, which is the metal input electrode. The first input electrode 732 is coupled to second pin P2; feedback electrode 734 is coupled to first pin P1 through resistor Rg and resistor Re; and the second input electrode 736 is coupled to third pin P3. A resistor Rd has a first terminal coupled to a node 738 between resistor Re and first pin P1 and a second terminal coupled to the lower supply voltage. Similarly, resistor Rf has a first terminal coupled to a node 740 between resistor Re and resistor Rg and a second terminal coupled to a node 742 between the second input electrode 736 and the third pin P3. A capacitor C has a first terminal coupled to node 740 and a second terminal coupled to a node 744 between the first input electrode 732 and the second pin P2.

Because piezo buzzer 722 is self-driving, the feedback provided from feedback electrode 734 will cause piezo buzzer to vibrate at its resonant frequency. However, due to small differences between various piezoelectric buzzers and the variations that occur during fabrication of IC chip 720, the duty cycle of the signals provided to the first input electrode 732 and second input electrode 736 may not be at the desired fifty percent, so that piezo buzzer 722 is unable to provide the loudest possible sound.

Figure 1:
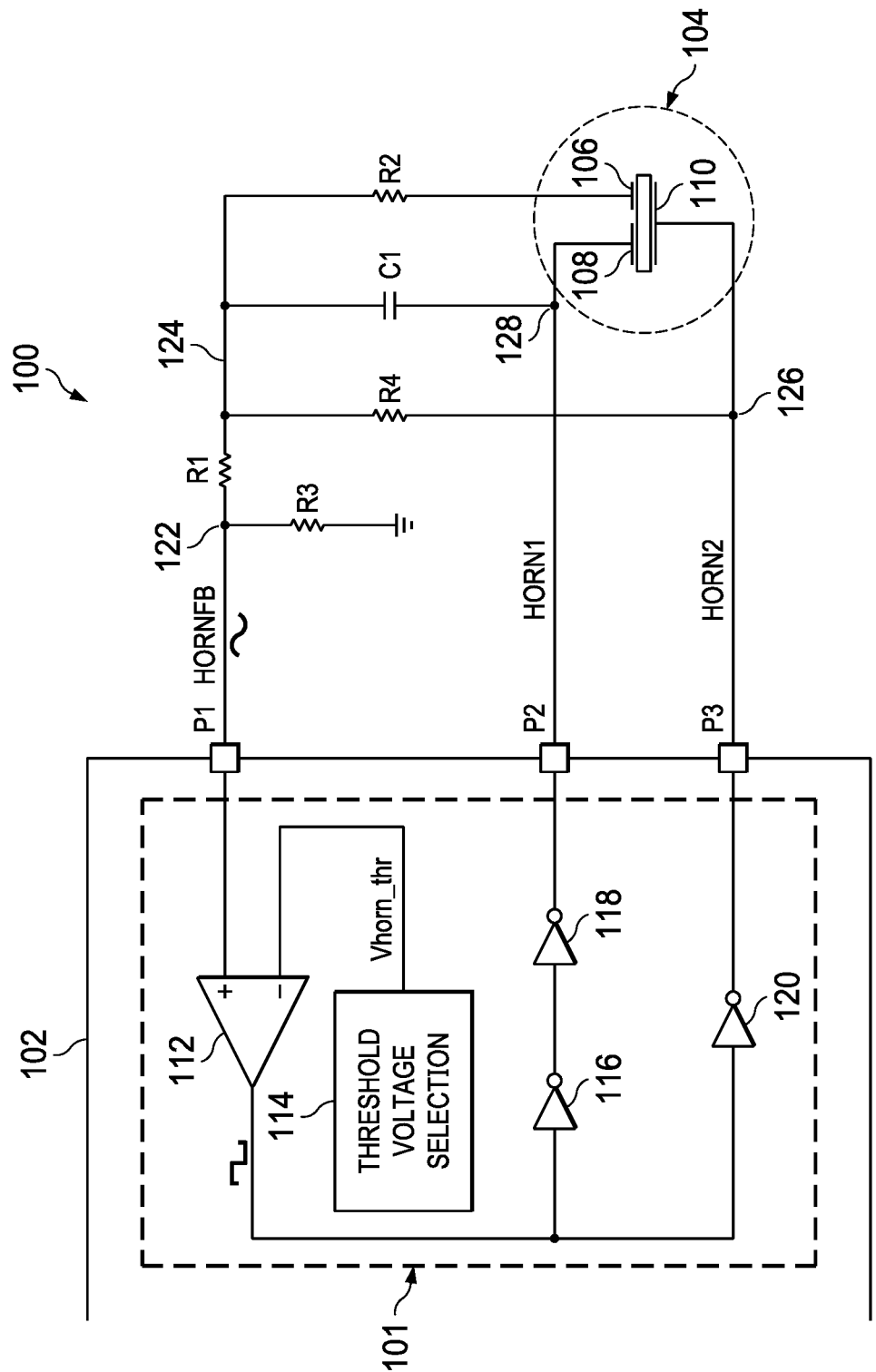
FIG. 1 depicts a block diagram of an electronic device that includes a driver circuit and a piezo buzzer according to an embodiment of the disclosure.

FIG. 1 depicts an electronic device 100 that includes a driver circuit 101 on an IC chip 102 and a piezo buzzer 104 according to an embodiment of the disclosure. IC chip 102 again contains first pin P1 that is coupled to the feedback electrode 106 of piezo buzzer 104 through first resistor R1 and second resistor R2, second pin P2 that is coupled to first input electrode 108, and third pin P3 that is coupled to second input electrode 110. Third resistor R3 has a first terminal that is coupled to a first node 122 between first pin P1 and first resistor R1 and a second terminal that is coupled to the lower supply voltage. Fourth resistor R4 has a first terminal that is coupled to a second node 124 that is between first resistor R1 and second resistor R2 and a second terminal that is coupled to a third node 126 between third pin P3 and second input electrode 110. A capacitor C1 is coupled between the second node 124 and a fourth node 128 between the second pin P2 and the first input electrode 108. The external connections shown will help the piezo buzzer 104 achieve a resonant frequency.

Driver circuit 101 differs from driver circuit 721 in that the analog-to-digital buffer 724 in driver circuit 721 is replaced by a comparator 112 that has a non-inverting input coupled to the first pin P1 to receive a horn feedback signal HORNFB from the feedback electrode 106 and also has an inverting input coupled to a threshold voltage selection circuit 114. The threshold voltage selection circuit 114 is coupled to provide a horn comparator threshold voltage Vhorn_thr that is programmable, as will be described in greater detail below. A first inverter 116 and a second inverter 118 are coupled in series between an output of comparator 112 and the second pin P2. Third inverter 120 is coupled between the output of comparator 112 and the third pin P3. It will be understood that although driver circuit 101 is shown with two inverters coupled to the second pin P2 and one inverter coupled to the third pin P3, the important relationship is that the signal presented on third pin P3 is inverted from the signal presented on second pin P2. This can be accomplished by having a first set of inverters and a second set of inverters, with one set having an odd number of inverters and a remaining set having an even number of inverters.

During operation of driver circuit 101, threshold voltage selection circuit 114 is provided with a horn comparator threshold selection signal (not specifically shown) that directs threshold voltage selection circuit 114 to provide a selected horn comparator threshold voltage to comparator 112. When driver circuit 101 and piezo buzzer 104 are paired with each other, driver circuit 101 can be tested using two or more different values of the horn comparator threshold settings, each of which designates a corresponding available horn comparator threshold voltage. The horn comparator threshold setting that provides a duty cycle of the drive voltages that is closest to fifty percent can be used during operation of the electronic device 100.

Threshold voltage selection circuit 114 would generally be tested and programmed at or near the time that IC chip 102 and piezo buzzer 104 are assembled together, so that the driver circuit 101 can be further tuned to elicit the loudest response from piezo buzzer 104. This programming can take a number of forms, one of which will be explained in greater detail below. By programming the horn comparator threshold voltage to a value that most nearly brings about a fifty percent duty cycle, the amplitude can be maximized and common mode voltage variation of the feedback analog signal can be cancelled or reduced.

Figure 1A:
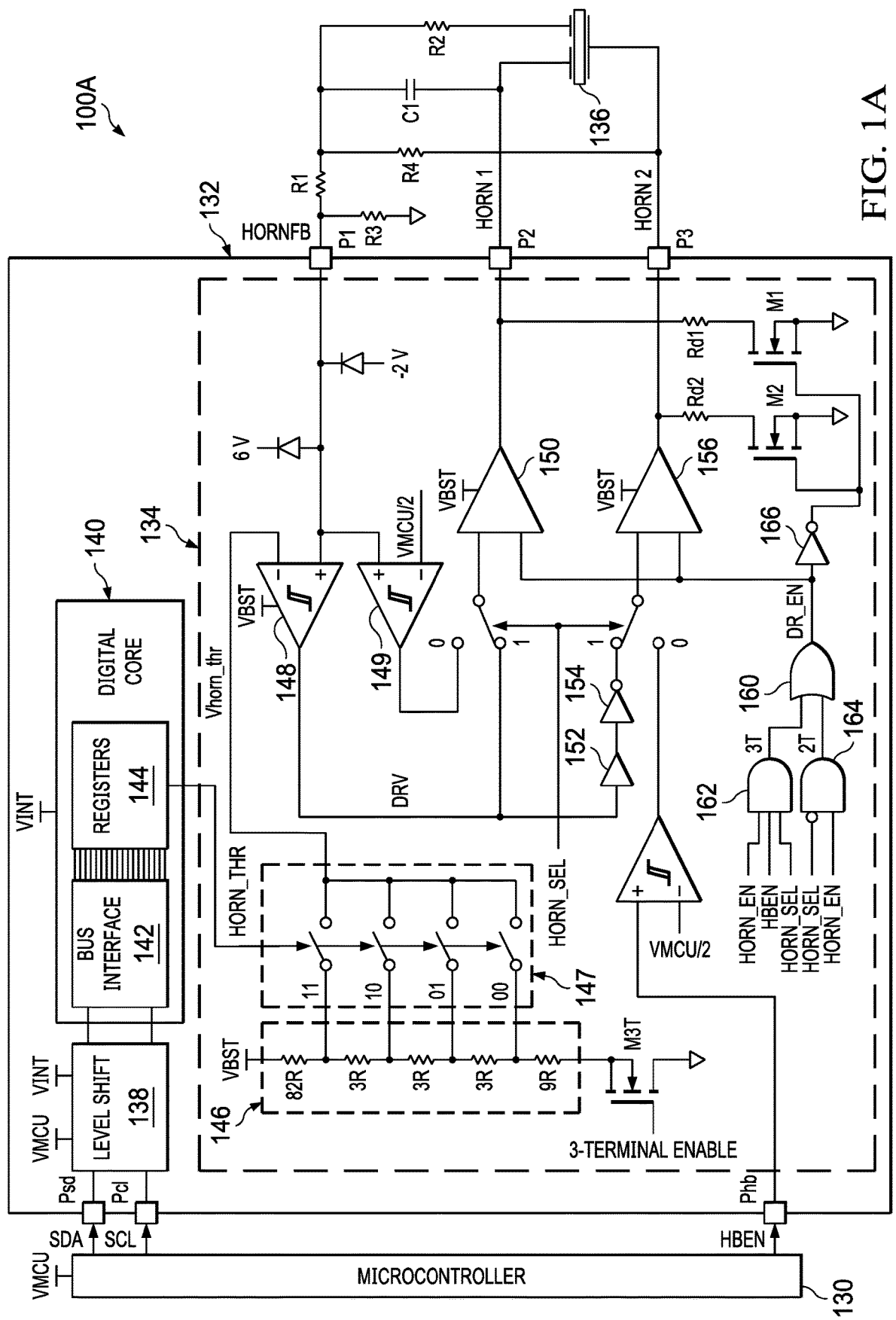
FIG. 1A depicts a block diagram of an electronic device that includes a driver circuit and a piezo buzzer according to an embodiment of the disclosure.

FIG. 1A depicts in greater detail one embodiment of an electronic device 100A that includes the disclosed driver circuit. In this embodiment, the electronic device 100A is a smoke alarm. An IC chip 132 containing a driver circuit 134 is coupled between a microcontroller 130 and a piezo buzzer 136. In the embodiment shown, IC chip 132 is able to control either a two-terminal piezo buzzer, i.e., a piezo buzzer that does not use feedback, or a three-terminal piezo buzzer, which does utilize feedback, although the capability to drive both types of piezo buzzer is not required for the disclosed embodiment. A horn selection signal HORN_SEL can be set to zero for a two-terminal piezo buzzer and to one for a three-terminal piezo buzzer. Because the present application is directed to a piezo buzzer that utilizes feedback, some portions of IC chip 132 are not discussed in detail herein. Two comparators are provided in driver circuit 134: comparator 148 is used with a three-terminal piezo buzzer and will receive a horn comparator threshold voltage Vhorn_thr that is programmable, while comparator 149 is used with a two-terminal piezo buzzer and receives a fixed horn comparator threshold voltage.

IC chip 132 is coupled to receive three signals from microcontroller 130 that are relevant to operation of the piezo buzzer or horn: serial data signal SDA, which is received on a serial data pin Psd, serial clock signal SCL, which is received on a serial clock pin Pcl, and pin-controlled horn enable signal HBEN, which is received on a horn enable pin Phb. Serial data signal SDA and serial clock signal SCL are both part of a messaging bus, which in one embodiment is an Inter-Integrated Circuit (I2C) bus. When a three-terminal piezo buzzer 136 is used, pin-controlled horn enable signal HBEN is used to turn on the piezo buzzer 136 when either smoke is detected or a test of the piezo buzzer is initiated. Serial data signal SDA and serial clock signal SCL are both received by a level shift circuit 138, which shifts serial data signal SDA and serial clock signal SCL from a microcontroller voltage VMCU to an internal voltage VINT and provides these two signals to a bus interface 142 in the digital core 140. In one embodiment, bus interface 142 is an I2C interface.

I2C is a standard protocol for sending serial information from one IC to another IC and is the bus protocol used in one embodiment discussed herein. However, it will be understood that other protocols can also be used. In one embodiment, the microcontroller 130 sends a horn comparator threshold setting HORN_THR to bus interface 142 in the digital core 140 to indicate which of four possible threshold voltages should be used for the horn comparator threshold voltage Vhorn_thr. The bus interface 142 interprets the received horn comparator threshold setting HORN_THR and stores the value in one of a plurality of registers 144. The digital core 140 will pass the horn comparator threshold setting HORN_THR through a digital line connected to driver circuit 134.

As seen in driver circuit 134, a resistor ladder 146 is coupled in series with a cutoff NFET M3T between a boosted voltage VBST and the lower supply voltage and each of a plurality of switches 147 has a first terminal that is coupled to a respective point on the resistor ladder 146 and a second terminal that can be selectively coupled to the inverting input of comparator 148. Together, resistor ladder 146 and the plurality of switches 147 provide one embodiment of threshold voltage selection circuit 114. When the 3-terminal option is selected, cutoff NFET M3T is turned on to provide the various horn comparator threshold voltages Vhorn_thr and digital core 140 sends the selected horn comparator threshold setting HORN_THR to close one of the switches in the plurality of switches 147 and provide a selected horn comparator threshold voltage Vhorn_thr to the inverting input of comparator 148. In one embodiment, a horn comparator threshold setting HORN_THR of "00" provides a horn comparator threshold voltage Vhorn_thr that is 9% of boosted voltage VBST, a horn comparator threshold setting of "01" provides a horn comparator threshold voltage Vhorn_thr that is 12% of boosted voltage VBST, a horn comparator threshold setting of "10" provides a horn comparator threshold voltage Vhorn_thr that is 15% of boosted voltage VBST, and a horn comparator threshold setting of "11" provides a horn comparator threshold voltage Vhorn_thr that is 18% of boosted voltage VBST. It will be understood that both the number and spread of possible voltages that can be selected are variables that can be adjusted as necessary or desired.

When a three-terminal piezo buzzer is used with IC chip 132, the output of comparator 148 can be coupled to second pin P2 through amplifier 150 and can also be coupled to third pin P3 through delay buffer 152, inverter 154 and amplifier 156.

Once a horn comparator threshold voltage Vhorn_thr is selected, comparator 148 is set to transform the analog signal received on first pin P1 and to output a digital drive signal DRV. Digital drive signal DRV is provided to first amplifier 150, which sends the amplified signal to second pin P2 as first horn control signal HORN1. Digital drive signal DRV is also sent to delay buffer 152 and then to inverter 154, which provides a delayed, inverted version of digital drive signal DRV to second amplifier 156. Amplifier 156 sends a second horn control signal HORN2 to third pin P3.

Electronic device 100A also includes first resistor R1, second resistor R2, third resistor R3, fourth resistor R4 and capacitor C1 arranged similarly to electronic device 100 seen in FIG. 1. These external components in combination with the delay provided by delay buffer 152 are all part of driving the piezo buzzer 136 to the resonant frequency.

An AND gate 162 is coupled to receive three signals—a register-controlled horn enable signal HORN_EN, which is a register value, the pin-controlled horn enable signal HBEN, which can be provided by the microcontroller 130, and a horn selection signal HORN_SEL, which has a value of zero for a two-terminal piezo buzzer and a value of one for a three-terminal piezo buzzer—and to provide a three-terminal enable signal 3T. Similarly, AND gate 164 is coupled to receive two signals—the inverse of horn selection signal HORN_SEL and register-controlled horn enable signal HORN_EN—and to provide a two-terminal enable signal 2T. An OR gate is coupled to the output of both AND gate 162 and AND gate 164. The output of OR gate 160 is coupled to provide a driver enable signal DR_EN to amplifiers 150, 156. Driver enable signal DR_EN is also provided through inverter 166 to the gates of first NFET M1 and second NFET M2. First NFET M1 is coupled between the second pin P2 and the lower supply voltage and second NFET M2 is coupled between the third pin P3 and the lower supply voltage. In one embodiment, a first discharge resistor Rd1 having a resistance of 120 kΩ is coupled between second pin P2 and first NFET M1 and a second discharge resistor Rd2 also having a resistance of 120 kΩ is coupled between third pin P3 and second NFET M2.

OR gate 160, along with AND gates 162, 164, are used to enable the piezo horn driver 134 with either a three-terminal piezo buzzer or a two-terminal piezo buzzer. With a three-terminal piezo buzzer, high values in each of the register-controlled horn enable signal HORN_EN, the pin-controlled horn enable signal HBEN, and the horn selection signal HORN_SEL are required to set the three-terminal signal 3T high: With a two-terminal piezo buzzer, a low value in horn selection signal HORN_SEL and a high value in register-controlled horn enable signal HORN_EN are required to set the two-terminal signal 2T high. A high signal on either of three-terminal signal 3T or two-terminal signal 2T causes driver enable signal DR_EN to be high, which enables first amplifier 150 and second amplifier 156 and turns off first NFET M1 and second NFET M2. When neither the three-terminal signal 3T nor the two-terminal signal 2T are high, driver enable signal DR_EN is low, which disables first amplifier 150 and second amplifier 156 and turns on first NFET M1 and second NFET M2. First NFET M1 and second NFET M2 provide a discharge path if, for example, the electronic device 100A is dropped, causing deformation in piezo buzzer 136 and generating a high voltage from piezo buzzer 136.

Figure 2A:
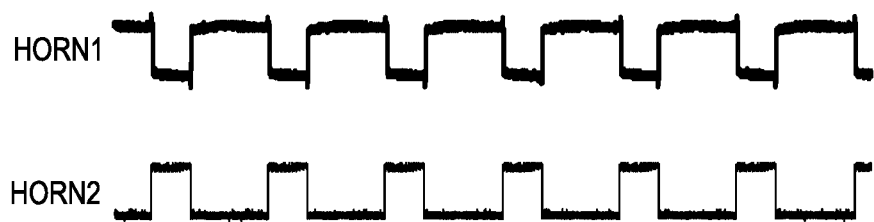
FIGS. 2A-2D each depicts a duty cycle achieved using different horn comparator threshold settings for the comparator according to an embodiment of the disclosure.
Figure 2B:
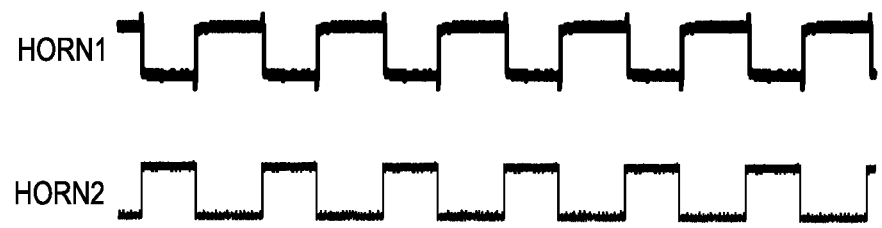
Figure 2C:
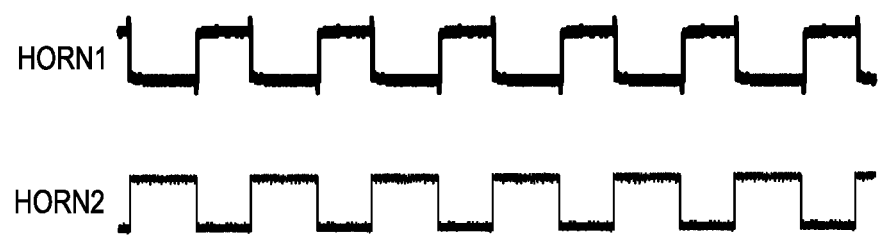
Figure 2D:
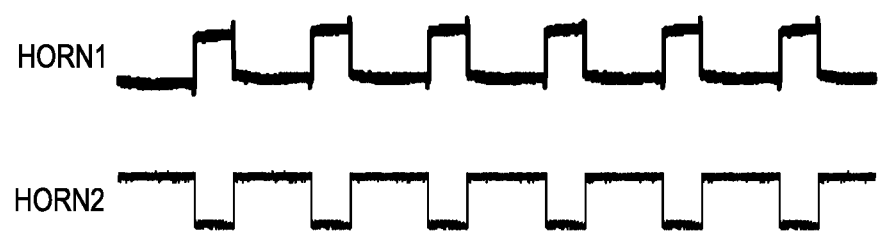

FIGS. 2A-2D graphically depict bench measurements of the duty cycle of the first horn control signal HORN1 and the second horn control signal HORN2 used to drive piezo buzzer 104. In FIGS. 2A-2D, the horn comparator threshold voltage Vhorn_thr is set successively to each of the four different settings. As seen in FIG. 2A in which the horn comparator threshold setting HORN_THR is set to "00", the duty cycle of the first horn control signal HORN1 is greater than 50% and was measured at 54.44%. In FIG. 2B with the horn comparator threshold setting HORN_THR set to "01", the duty cycle of the first horn control signal HORN1 is 51.55. Similarly, in FIG. 2C with the horn comparator threshold setting HORN_THR set to "10", the duty cycle of the first horn control signal HORN1 is 48.65% and in FIG. 2B with the horn comparator threshold setting HORN_THR at "11", the duty cycle of the first horn control signal HORN1 is 44.42%. Table 1 provides the information from FIGS. 2A-2D more succinctly and also clarifies that changing the value of the horn comparator threshold voltage Vhorn_thr does not change the frequency of the driving signal, but significantly alters the duty cycle. Since alternative values are provided, the piezo buzzer used in this embodiment can receive a horn comparator threshold setting HORN_THR of "10", while other values may be used for other piezo buzzers and circuits.

TABLE 1

| HORN_THR | Freq. [kHz] | HORNSL Duty Cycle |
|---|---|---|
| 00 | 3.867 | 54.44 |
| 01 | 3.870 | 51.55 |
| 10 | 3.872 | 48.65 |
| 11 | 3.875 | 44.42 |

Figure 3:
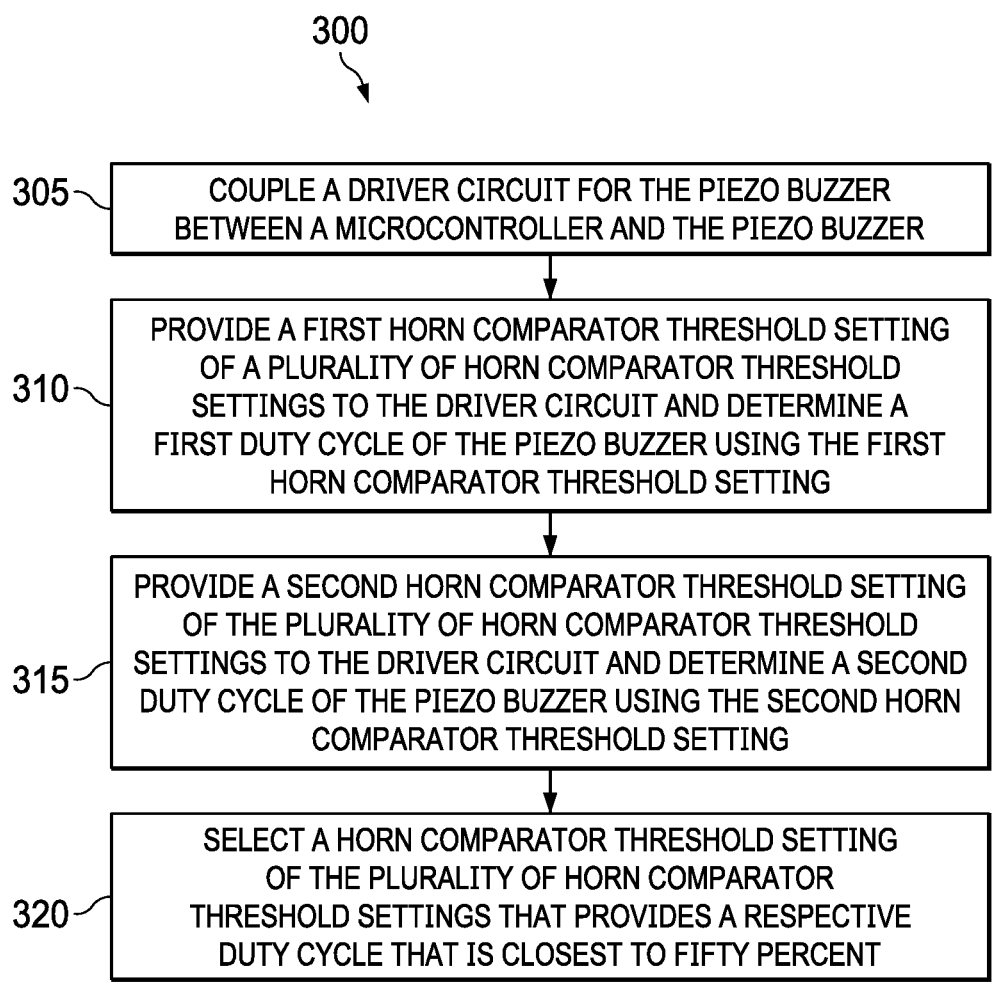
FIG. 3 depicts a method of operating a driver for a piezo buzzer according to an embodiment of the disclosure.

FIG. 3 depicts a method 300 of operating a piezo buzzer in an electronic device such as a smoke alarm. The disclosed method requires testing of the piezo buzzer and driver circuit combination in order to determine the best the horn comparator threshold setting HORN_THR. This method was selected in order to keep the circuitry as simple as possible and the power requirements low. Duty cycle correction circuits are currently used in many public land mobile network (PLMN) circuits to provide self-correction of the duty cycle. In an embodiment of driver circuit 101 in which the circuit complexity and/or power requirements are less important, one of these duty cycle correction circuits could be adapted to replace the threshold voltage selection circuit 114 in driver circuit 101. Method 300 would typically be performed during assembly and testing of the electronic device and prior to making the electronic device available for use.

Method 300 starts with coupling 305 a driver circuit for the piezo buzzer between a microcontroller and the piezo buzzer. In one embodiment, the driver circuit is part of an IC chip that provides both power and a number of detection circuits for a smoke alarm. The method continues with providing 310 a first horn comparator threshold setting of a plurality of horn comparator threshold settings to the driver circuit, followed by determining a first duty cycle of the piezo buzzer using the first horn comparator threshold setting. Next, the method continues with providing 315 a second horn comparator threshold setting of the plurality of horn comparator threshold settings to the driver circuit and determining a second duty cycle of the piezo buzzer using the second horn comparator threshold setting. If there are only two horn comparator threshold settings or if the first two horn comparator threshold settings closely bracket the desired fifty percent duty cycle, method 300 can conclude with selecting 320 a horn comparator threshold setting of the plurality of horn comparator threshold settings that provides a respective duty cycle that is closest to fifty percent.

Figure 3A:
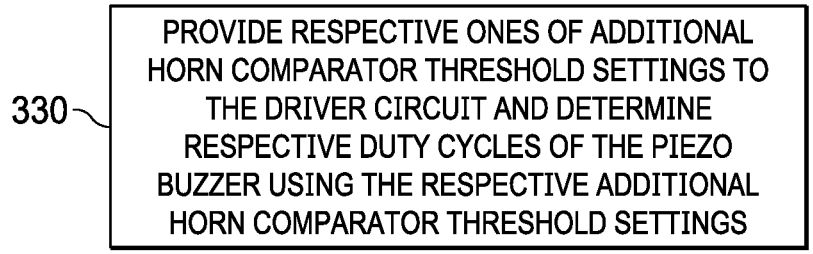
FIGS. 3A-3C depict additional elements of the method of FIG. 3 according to an embodiment of the disclosure.

It can be noted that in one embodiment, a microcontroller provides the first horn comparator threshold setting, the second horn comparator threshold setting and the selected horn comparator threshold setting to the IC chip containing the driver circuit and does so over a bus using a bus protocol, of which I2C is one possible bus protocol. If additional horn comparator threshold settings are available and the desired closeness to a fifty percent duty cycle has not yet been established, then prior to selecting the programmable threshold, the method continues in FIG. 3A with providing 330 respective ones of the additional horn comparator threshold settings to the driver circuit and determining respective duty cycles of the piezo buzzer using the respective additional horn comparator threshold settings. Once all available or desired horn comparator threshold settings have been checked, a final selection can be made of the horn comparator threshold setting that provides a duty cycle closest to fifty percent.

Figure 3B:
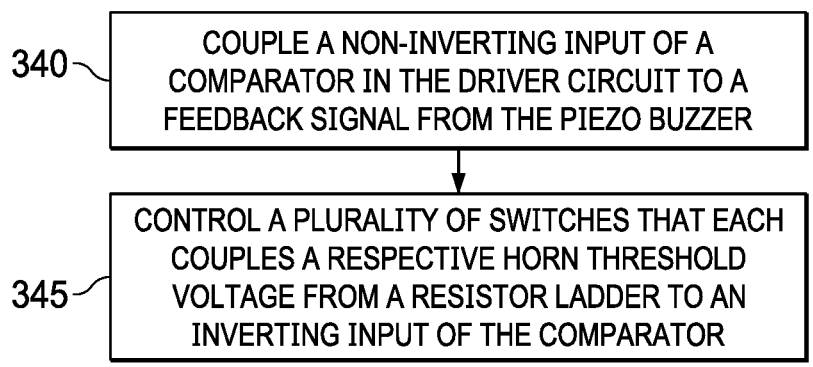

In one embodiment, the element of providing a respective horn comparator threshold setting includes the elements shown in FIG. 3B, i.e., coupling 340 a non-inverting input of a comparator in the driver circuit to a feedback signal from the piezo buzzer and controlling 345 a plurality of switches that each couples a respective horn comparator threshold voltage from a resistor ladder to an inverting input of the comparator. In one embodiment, the element of determining a respective duty cycle comprises activating 350 the driver circuit and measuring 355 a duty cycle of an output signal sent by the comparator.

Figure 3C:
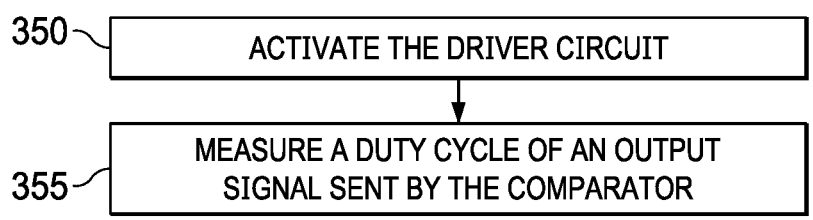
Figure 4:
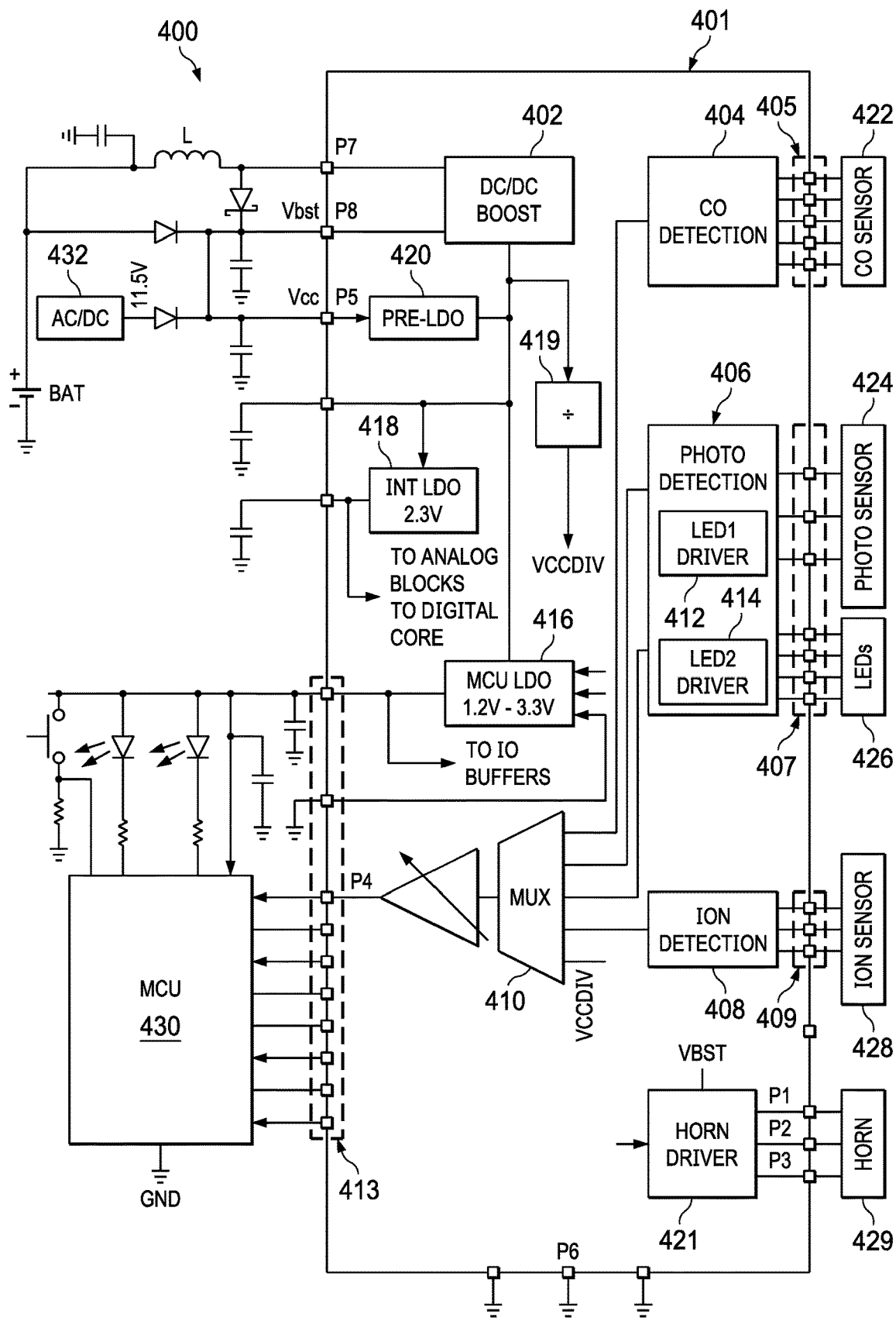
FIG. 4 depicts a block diagram of a smoke alarm that can include the disclosed driver circuit according to an embodiment of the disclosure.

FIG. 4 depicts a block diagram of an electronic device that is a smoke alarm 400 incorporating a horn driver circuit 421 according to an embodiment of the disclosure. Smoke alarm 400 includes an IC chip 401 on which a number of circuits are implemented, including horn driver circuit 421, which can be implemented using the circuits shown in one of driver circuit 101 and driver circuit 134 and the method(s) as discussed in FIGS. 3-3C. IC chip 401 also includes a carbon monoxide detection circuit 404, a photo-detection circuit 406, an optional ion detection circuit 408, and a horn driver 421. In one embodiment, photo-detection circuit 406 includes a first light-emitting diode (LED) driver 412 and a second LED driver 414. Carbon monoxide detection circuit 404 is coupled to a plurality of CO-detection pins 405; photo-detection circuit 406 is coupled to a plurality of photo-detection pins 407; and horn driver 421 is coupled to first pin P1, second pin P2 and third pin P3. Multiplexor 410, which is coupled to a fourth pin P4 that is part of a plurality of multiplexor pins 413, can receive input signals from each of carbon monoxide detection circuit 404 and photo-detection circuit 406. When optional ion detection circuit 408 is provided, ion detection circuit 408 is coupled to a plurality of ion-detection pins 409 and multiplexor 410 is also coupled to receive input signals from ion detection circuit 408. A piezo buzzer, shown here as horn 429, is coupled to first pin P1, second pin P2 and third pin P3.

A number of power supply pins are noted in IC chip 401. A pre-regulator circuit 420 is coupled to fifth pin P5, which is coupled, external to IC chip 401, to an AC/DC converter 432 that can be coupled to receive voltage Vcc. Pre-regulator circuit 420 is also coupled to sixth pin P6 (coupling not specifically shown) to receive a lower supply voltage. A DC/DC boost converter 402 is coupled to seventh pin P7 to receive power from battery BAT through an inductor L and is also coupled to eighth pin P8 to provide a boosted voltage Vbst from the battery power. Eighth pin P8 is also coupled to fifth pin P5, which provides the boosted voltage Vbst to pre-regulator circuit 420 when battery power is relied on. Sixth pin P6 is coupled to a ground plane, although the internal connections to the circuits are not specifically shown.

Pre-regulator circuit 420 provides a pre-regulator output voltage Vprereg, which will be used to provide a clamped supply voltage for internal circuits on IC chip 401. The pre-regulator output voltage Vprereg can be distributed to microcontroller (MCU) LDO regulator 416, internal LDO regulator 418 and Vcc divider 419. MCU LDO regulator 416 provides a supply voltage to MCU 430 and the I/O buffers (not specifically shown); internal LDO regulator 418 provides a supply voltage to internal circuits such as the digital logic core and the analog blocks, e.g., the carbon monoxide detection circuit 404, photo-detection circuit 406 and ion detection circuit 408; and Vcc divider 419 provides a supply voltage to multiplexor 410.

In smoke alarm 400, carbon monoxide detection circuit 404 is coupled to carbon monoxide sensor 422 through the plurality of CO-detection pins 405; photo-detection circuit 406, which can include first LED driver 412 and second LED driver 414, is coupled to photo sensor 424 and LEDs 426 through the plurality of photo-detection pins 407; ion detection circuit 408 is coupled to ion sensor 428 through the plurality of ion-detection pins 409; and horn driver 421 is coupled to a horn 429 through first pin P1, second pin P2 and third pin P3. The carbon monoxide sensor 422, photo sensor 424 and ion sensor 428 collect the information needed to detect smoke and carbon monoxide in the area, while horn 429 provides a loud audible alert when smoke or carbon monoxide are detected. IC chip 401 is also coupled to microcontroller 430 though the plurality of microcontroller pins 413, with IC chip 401 supplying both power and information to microcontroller 430 and receiving instructions to control various aspects of operation of smoke alarm 400. The fourth pin P4, which is part of the plurality of microcontroller pins 413, provides a path for the multiplexor 410 to provide the outputs of the carbon monoxide detection circuit 404, photo-detection circuit 406, and ion detection circuit 408 to MCU 430.

Applicants have demonstrated that the ability to change the voltage threshold to which the horn feedback signal is compared changes the duty cycle of the driving signal and can be used to compensate for variations in the common mode and amplitude of the feedback signal from piezo buzzer from part to part. In combination with the current practices of automatically tuning the frequency and setting the amplitude of the signal, adjusting the duty cycle can further tune each piezo buzzer to the maximum loudness the piezo buzzer is capable of providing. Setting the duty cycle for the piezo buzzer can become a routine part of assembling an electronic device that utilizes the piezo buzzer, e.g., a smoke alarm. Applicants have further demonstrated an electronic device containing a driver circuit that provides a programmable horn voltage threshold. The electronic device can be a circuit, an IC chip, or a system such as a smoke alarm that includes a piezo buzzer.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:
1. An electronic device comprising:
   a threshold voltage selection circuit having an input coupled to a digital core, and an output configured to provide a selectable horn comparator threshold voltage, the threshold voltage selection circuit including:

a resistor ladder coupled between an upper supply voltage terminal and a lower supply voltage terminal; and switches having respective first switch terminals coupled to respective locations on the resistor ladder, and having respective second switch terminals selectively coupled to the output of the threshold voltage selection circuit; and a comparator having a non-inverting input coupled to a first terminal, and an inverting input coupled to the output of the threshold voltage selection circuit, and having a comparator output.

2. The electronic device of claim 1 in which the digital core includes:

a bus interface coupled to a serial data terminal and to a serial clock terminal, the bus interface operating under a bus protocol; and registers that include a register for storing a horn comparator threshold setting, wherein the digital core is configured to utilize the horn comparator threshold setting to control the switches.

3. The electronic device of claim 2 in which the bus protocol is Inter-Integrated Circuit (I2C) protocol.

4. The electronic device of claim 1 in which the threshold voltage selection circuit includes a cutoff N-type field effect transistor (NFET) coupled between the resistor ladder and the lower supply voltage terminal, the cutoff NFET configured to be turned on when the threshold voltage selection circuit is active.

5. The electronic device of claim 4 including:

a first set of inverters coupled between the output of the comparator and a second terminal; and a second set of inverters coupled between the comparator output and a third terminal, one of the first set and the second set of inverters has an odd number of inverters and a remaining set has an even number of inverters.

6. The electronic device of claim 4 including:

a first amplifier coupled between the comparator output and a second terminal; and a delay buffer, an inverter and a second amplifier coupled in series between the comparator output and a third terminal.

7. The electronic device of claim 6 including:

a first NFET coupled between the second terminal and the lower supply voltage terminal; and a second NFET coupled between the third terminal and the lower supply voltage terminal, the first NFET and the second NFET being configured to be on when the driver circuit is not enabled.

8. The electronic device of claim 7 including:

a first discharge resistor coupled between the second terminal and the first NFET; and a second discharge resistor coupled between the third terminal and the second NFET.

9. The electronic device of claim 2, in which the electronic device is part of an integrated circuit chip that also includes:

a carbon monoxide (CO) detection circuit having inputs configured to be coupled to a CO sensor, and having a CO detection output;

a photo-detection circuit having inputs configured to be coupled to a photosensor, and having a photo-detection output; and a multiplexer having a first input coupled to the CO detection output, a second input coupled the photo-detection output, and having an output coupled to a fourth terminal.

10. The electronic device of claim 9 in which the integrated circuit chip includes an ion detection circuit having inputs configured to be coupled to an ion sensor, and having an ion detection output, and the multiplexer further has a third input coupled to the ion detection output.

11. The electronic device of claim 9 in which the electronic device includes:

a smoke alarm;

a piezo buzzer coupled to the integrated circuit and having a first input electrode coupled to the second terminal, a second input electrode opposite the first input electrode and coupled to the third terminal, and the piezo buzzer having a feedback terminal that is coupled to the first terminal; and a microcontroller coupled to the fourth terminal.

12. The electronic device of claim 11 in which the smoke alarm includes:

a carbon monoxide sensor coupled to the CO detection circuit; and a photo sensor coupled to the photo-detection circuit.

13. The electronic device of claim 12 in which the integrated circuit chip includes an ion detection circuit having inputs configured to be coupled to an ion sensor, and having an ion detection output, and the multiplexer further has a third input coupled to the ion detection output.

14. A method of operating a piezo buzzer, the method comprising:

coupling a piezo buzzer driver circuit between a microcontroller and the piezo buzzer;

providing a first horn comparator threshold setting to the driver circuit, and determining a first duty cycle of the piezo buzzer using the first horn comparator threshold setting;

providing a second horn comparator threshold setting to the driver circuit, and determining a second duty cycle of the piezo buzzer using the second horn comparator threshold setting, wherein providing first and second comparator threshold settings includes:

coupling a non-inverting input of a comparator in the driver circuit to a feedback electrode of the piezo buzzer; and controlling switches that provide a respective horn comparator threshold voltage from a resistor ladder to an inverting input of the comparator; and selecting a horn comparator threshold setting that provides a respective duty cycle that is closest to fifty percent.

15. The method of claim 14 in which determining a respective duty cycle includes:

activating the driver circuit; and measuring a respective duty cycle of a comparator output signal.

16. The method of claim 14 in which the microcontroller provides the first horn comparator threshold setting, the second horn comparator threshold setting and the selected horn comparator threshold setting to an integrated circuit containing the driver circuit using a bus and a bus protocol.

17. The method of claim 16 in which the bus protocol is Inter-Integrated Circuit (I2C).

18. The method of claim 14 including, prior to performing the selecting, providing additional horn comparator threshold settings to the driver and determining respective duty cycles of the piezo buzzer using the respective additional horn comparator threshold settings.

19. A piezoelectric driver circuit comprising:

(a) threshold voltage selection circuitry having a selection input and having a threshold voltage output;

(b) comparator circuitry having a first input adapted to be coupled to a feedback electrode of a piezoelectric device, having a second input coupled to the threshold voltage output, and having a comparator output;

(c) first amplifier circuitry having an input coupled to the comparator output and having a first output adapted to be coupled to an input electrode of the piezoelectric device;

(d) delay circuitry having an input coupled to the comparator output and having a delay output; and (e) second amplifier circuitry having an input coupled to the delay output and having a second output adapted to be coupled to an input electrode of the piezoelectric device.

20. The piezoelectric driver circuit of claim 19 in which the threshold voltage selection circuitry includes a resistor ladder and switches coupled to the resistor ladder, the switches providing the threshold voltage output.

21. The piezoelectric driver circuit of claim 19 including:
a digital core having registers adapted to contain switch selection signals, and providing a horn threshold output; and
a resistor ladder, in the threshold voltage selection circuitry, and switches coupled to the resistor ladder, the switches having an input coupled to the horn threshold output and providing the threshold voltage output.

22. The piezoelectric driver circuit of claim 19 including:
a bus interface having inputs adapted to be coupled to a controller and having register outputs;
a digital core having registers coupled to the register output and having a horn threshold output; and
the threshold voltage selection circuitry including a resistor ladder and switches coupled to the resistor ladder, the switches having an input coupled to the horn threshold output and providing the threshold voltage output.

23. The piezoelectric driver circuit of claim 19 including:
a bus interface having inputs adapted to be coupled to a controller and having register outputs;
a digital core having registers coupled to the register output, and having register outputs;
the first amplifier circuitry also having a first logic input;
the second amplifier circuitry also having a second logic input; and
logic circuitry having inputs coupled to the register outputs and having an output coupled to the first logic input and the second logic input.

24. The piezoelectric driver circuit of claim 19 in which the piezoelectric driver circuit is formed on an integrated circuit chip, and the integrated circuit chip includes:
an ion detection circuit;
a photo detection circuit; and
a CO detection circuit.

25. The piezoelectric driver circuit of claim 19 in which:
the piezoelectric driver circuit is formed on an integrated circuit chip, and the integrated circuit chip includes:
an ion detection circuit having a detection output;
a photo detection circuit having a detection output;
a CO detection circuit having a detection output; and
a microcontroller coupled to the detection outputs.

26. A process of operating a piezoelectric device comprising:
(a) providing a threshold voltage in response to selecting a threshold setting;
(b) comparing the threshold voltage to a piezoelectric feedback voltage in a comparator and producing a comparator output signal;

(c) amplifying the comparator output signal in a first amplifier and applying the first amplified comparator output signal to a piezoelectric input electrode;

(d) delaying the comparator output signal to produce a delayed comparator signal; and (e) amplifying the delayed comparator signal in a second amplifier and applying the second amplified delayed comparator output signal to a piezoelectric metal input electrode.

27. The process of claim 26 in which the selecting includes selecting one threshold setting for operating a piezoelectric device at close to 50% duty cycle.

28. The process of claim 26 in which the providing a threshold voltage includes operating switches coupled to a resistor ladder in response to the threshold setting.

29. The process of claim 26 in which the selecting a threshold setting includes selecting one threshold setting in one register from different threshold settings in different registers.

30. The process of claim 26 in which operating the first amplifier and the second amplifier is in response to a logic signal.

31. An integrated circuit comprising:
a first horn drive terminal, a second horn drive terminal, and a feedback terminal;
a digital core having registers including a horn voltage selection register;
a threshold voltage selection circuit having an input coupled to the voltage selection register and having a horn threshold voltage output, the threshold voltage selection circuit including:
a resistor ladder coupled between an upper supply voltage terminal and a lower supply voltage terminal; and
switches having respective first terminals coupled to a respective location on the resistor ladder, and second terminals selectively coupled to the output of the threshold voltage selection circuit; and
a comparator having a first input coupled to the feedback terminal, having a second input coupled to the horn threshold voltage output, and having a comparator output coupled to the first horn drive terminal and the second horn drive terminal.

32. The integrated circuit of claim 31 in which the threshold voltage selection circuit includes a cutoff transistor coupled between the resistor ladder and the lower supply voltage terminal.

33. The integrated circuit of claim 31 including inverters and amplifiers coupled between the comparator output and the first and second horn drive terminals.

34. The integrated circuit of claim 31 including:
an ion detection circuit coupled to ion-detection terminals;
a carbon monoxide detection circuit coupled to carbon monoxide detection terminals;
a photo-detection circuit coupled to photo-detection terminals; and
a multiplexor having inputs coupled to the ion detection circuit, the carbon monoxide detection circuit, and the photo-detection circuit, and having an analog output coupled to an analog output terminal.

35. The integrated circuit of claim 34 including a microcontroller coupled to the analog output terminal.

36. The integrated circuit of claim 31 in which the digital core includes:

a bus interface that operates under a bus protocol, the bus interface being coupled to a serial data terminal, to a serial clock terminal, and to the registers.

37. The integrated circuit of claim 31 including:

a piezoelectric horn coupled to the first horn drive terminal, the second horn drive terminal, and the feedback terminal; and a microcontroller coupled to the digital core.

* * * * *